United States Patent
Tamura et al.

(10) Patent No.: US 7,550,367 B2
(45) Date of Patent: Jun. 23, 2009

(54) METHOD FOR SEPARATING SEMICONDUCTOR SUBSTRATE

(75) Inventors: Muneo Tamura, Nagoya (JP); Yasuo Souki, Toyota (JP)

(73) Assignee: DENSO CORPORATION, Kariya (JP)

( * ) Notice: Subject to any disclaimer, the term of this patent is extended or adjusted under 35 U.S.C. 154(b) by 269 days.

(21) Appl. No.: 11/199,132

(22) Filed: Aug. 9, 2005

(65) Prior Publication Data

US 2006/0040472 A1 Feb. 23, 2006

(30) Foreign Application Priority Data

Aug. 17, 2004 (JP) ............................. 2004-237300

(51) Int. Cl.
   *H01L 21/00* (2006.01)
(52) U.S. Cl. ...................... 438/463; 438/460; 438/462; 438/464; 257/E21.001
(58) Field of Classification Search .......... 438/462–465
   See application file for complete search history.

(56) References Cited

U.S. PATENT DOCUMENTS

| | | | | |
|---|---|---|---|---|
| 4,729,971 A | * | 3/1988 | Coleman | ..................... 438/462 |
| 6,117,347 A | * | 9/2000 | Ishida | ......................... 216/52 |
| 6,211,488 B1 | * | 4/2001 | Hoekstra et al. | ........ 219/121.72 |
| 6,399,463 B1 | * | 6/2002 | Glenn et al. | .................. 438/463 |
| 6,562,698 B2 | * | 5/2003 | Manor | ......................... 438/460 |
| 6,849,524 B2 | * | 2/2005 | Shelton et al. | .............. 438/465 |
| 6,992,026 B2 | * | 1/2006 | Fukuyo et al. | .............. 438/797 |
| 7,008,861 B2 | * | 3/2006 | Andrews et al. | ............. 438/463 |
| 7,129,114 B2 | * | 10/2006 | Akram | ....................... 438/110 |
| 7,169,687 B2 | * | 1/2007 | Li et al. | ....................... 438/463 |
| 7,265,033 B2 | * | 9/2007 | Shigematsu et al. | ......... 438/463 |
| 2004/0002199 A1 | | 1/2004 | Fukuyo et al. | |
| 2005/0006728 A1 | * | 1/2005 | Shizuno | ...................... 257/642 |
| 2005/0082644 A1 | | 4/2005 | Ohkawa | |

* cited by examiner

*Primary Examiner*—Alexander G Ghyka
*Assistant Examiner*—Angel Roman
(74) *Attorney, Agent, or Firm*—Posz Law Group, PLC

(57) ABSTRACT

A method of separating a semiconductor substrate having an implementation member attached thereon includes a dividing process for at least the implementation member on the semiconductor substrate along a separation line, a placing process for film member on a same side as the implementation member, a forming process area by irradiating a laser beam from at least one of a first side of the semiconductor substrate having the implementation member and a second side that is an opposite side of the first side of the semiconductor substrate along the separation line with a focusing point of the laser beam aligned with a substance in the semiconductor substrate and severing/removing at least one semiconductor chip at the separation line from the semiconductor substrate.

8 Claims, 4 Drawing Sheets

METHOD FOR SEPARATING SEMICONDUCTOR SUBSTRATE

CROSS REFERENCE TO RELATED APPLICATION

This application is based on and claims the benefit of priority of Japanese Patent Application No. 2004-237300 filed on Aug. 17, 2004, the disclosure of which is incorporated herein by reference.

FIELD OF THE INVENTION

The present invention generally relates to a separation method of a semiconductor substrate.

BACKGROUND OF THE INVENTION

In recent years, semiconductor substrates are conventionally separated from a silicon wafer or the like by using a diamond blade. The separation method of the substrate suffers from problems such as a loss of cutting portion, that is, a blade width lost in the course of cutting, and a chipping of the substrate that deteriorates a yield rate of the substrate.

A method to cope with the above-described problems is disclosed in Japanese Patent Document JP-3408805 as shown in FIGS. 4A to 4C. In this method, a laser light is used to form a modified area in the semiconductor substrate by multiphoton absorption with a focused beam to a specific depth of the substrate. The modified layer in the substrate is used as a starting point of dicing. The dicing and separation of the substrate are explained in sequence in the figure.

As shown in FIG. 4A, a reverse side of a semiconductor substrate 1 (a surface that does not have an element formed thereon) has a Die Attach Film 2 (DAF: a film type adhesive) for implementing a semiconductor chip 1e that is separated from a wafer. An opposite side of the substrate 1 to the reverse side has a dicing film 5 (also known as a dicing sheet, or a dicing tape) for holding the chip 1e after separation by dicing. The DAF 2 and the dicing film 5 are, for example, made from a synthetic resin film with an adhesive pasted thereon.

A laser beam 4 is irradiated with a focus point P in a lower portion of the substrate 1 to trace a dicing line L1 from outside of the substrate 1 in a process of pre-dicing step. In this manner, a modified area 1c is formed in the substrate 1 as a collective form of cracks around the focus point P where thermal strain by concentration of the laser beam 4 is induced. Then, the depth of the focus point P is changed to form another modified area 1c that traces the dicing line L1. As a result, at least one layer of modified area 1c is formed in the substrate 1. Each of the dicing lines L1 is traced by the modified area 1c in this manner as shown in FIG. 4A. Then, the dicing film 5 is pulled toward both sides in directions indicated by arrows F2 and F3 in FIG. 4B to form a cut 1b in the modified area 1c along the dicing line L1 in the substrate 1c as a result of expansion of the crack with an application of shearing force. Then, a portion between the cuts 1b, 1b is moved by a pressing member 6 in an upper direction (shown as an arrow F4 in the figure) from the reverse side of the substrate 1 to remove the semiconductor chip 1e by tearing off the DAF 2 (FIG. 4C).

However, a conventional method of shearing leaves the DAF 2 in an irregular shape, that is, an actual tearing off line goes away from an intended line L1. In this case, the strength of implementation will decrease because of an insufficient space of adhesion when the DAF 2b has a size that is smaller than a standard size. In addition, the implementation will be defective when a residue DAF 2c extending from the semiconductor chip 1e (shown in FIG. 4C) prevents a normal implementation. The semiconductor chip 1e suffers from a same type of problem when the implementation of the chip 1e by soldering with a metal foil is substituted for the implementation by using the DAF. That is, it is problematic in the implementation of the semiconductor chip when the DAF or the metal foil is not suitably cut with the semiconductor chip.

SUMMARY OF THE INVENTION

In view of the above-described and other problems, it is an object of the present invention to provide a method of semiconductor chip separation for securely implement a semiconductor chip on a package or the like by appropriately cutting a DAF or a metal foil in a suitable size.

The present invention is intended to provide a separation method of a semiconductor substrate having an implementation member attached thereon. Separation of the substrate occurs in a direction of thickness of the substrate, that is, the substrate is cut by a virtual plane that is perpendicular to the substrate. The separation method includes an implementation member separation process, a film member placement process, a modified area formation process and a substrate removal process. In the implementation member separation process, at least the implementation member is cut along a separation line. In the film member placement process, the film member is placed on one side of the substrate that has the implementation member being cut in the above process for holding the separated implementation member together. In the modified area formation process, a modified area is formed by a laser beam irradiated from at least one of the implementation member side or an opposite side of the substrate along the separation line. The laser beam forms the modified area by putting a light focus of the laser beam in the substrate. The modified area is formed by an effect of multiphoton absorption. In the substrate removal process, a semiconductor chip is removed from the substrate by separation along the separation line prepared in the process described above.

In the separation method of the substrate in the present invention, the substrate is separated by a cut formed on the implementation member side along the separation line. The cut is formed first in the implementation member to reach the surface and the inside of the substrate.

Further, in the separation method in the present invention, the film placement process described above may be executed before the modified area formation process, or may be executed after the modified area formation process. That is, the implementation member separation process may be followed by the film placement process or the modified area formation process, to be concluded by the substrate removal process. In the modified area formation process, the laser beam may be irradiated from either side of the substrate at least twice to form the modified area along the separation line. In addition, the laser beam may be irradiated from the same side of the substrate in each occasion of irradiation, and the two laser beams may be originated in the same source of the laser beam.

The separation method described in the present invention executes the implementation member separation process before the substrate removal process. Therefore, the implementation member is separated along the separation line in an intended shape, that is, the implementation member securely holds an intended shape for implementation without being broken to be smaller than the substrate nor being jaggedly formed to be larger than the substrate.

In this manner, the implementation member is fittingly cut into a suitable size for the semiconductor chip, and defective implementation of the semiconductor chip is prevented. Further, the separation method with a formation of the modified area by the laser beam prevents the loss of the substrate caused by the width of the dicing blade and/or by chipping of the substrate in the course of separation.

The separation method in the present invention forms the modified area in the substrate along the separation line to be used as a partial cut of the substrate. Therefore, the thickness of the substrate at the partial cut becomes thinner than the other portion of the substrate, and irradiation time of the laser beam for separating the substrate becomes shorter than a standard time. Further, the force required for the separation becomes smaller.

The separation method in the present invention irradiates the laser beam from either one of the two surfaces of the substrate. Further, two laser beams may be irradiated at the same time from one source of the laser beam onto both sides of the substrate. In this manner, the substrate does not have to be flipped to receive the laser beam from both sides in the course of separation. Further, a laser beam irradiation system may be simplified when a single source of the laser beam generates two laser beams for the separation process, and thereby having a decreased production cost, a decreased maintenance cost and a decreased failure rate. Furthermore, the separation time is decreased when two layers of modified areas along the separation line are formed by two laser beams at the same time.

BRIEF DESCRIPTION OF THE DRAWINGS

Other objects, features and advantages of the present invention will become more apparent from the following detailed description made with reference to the accompanying drawings, in which.

DETAILED DESCRIPTION OF THE PREFERRED EMBODIMENTS

A method for separating a semiconductor substrate in the present invention is described with reference to the drawings.

First Embodiment

FIGS. 1A to 1D show cross-sectional views of a separation process of a semiconductor substrate in a first embodiment of the present invention.

The process in the first embodiment is further detailed in the following steps. That is, in the step shown in FIG. 1A, the semiconductor substrate 1 having a DAF 2 adhered on a reverse side 1g is diced along a separation line L1 by a diamond blade 3 that rotates in a high-speed rotation in a direction indicated by a circular arrow F1. The dicing blade reaches to a depth in the substrate 1. Each of the separation lines L1 is formed in this manner. A cut 1a is formed in the semiconductor substrate 1 along the separation line L1.

Figure 1A:
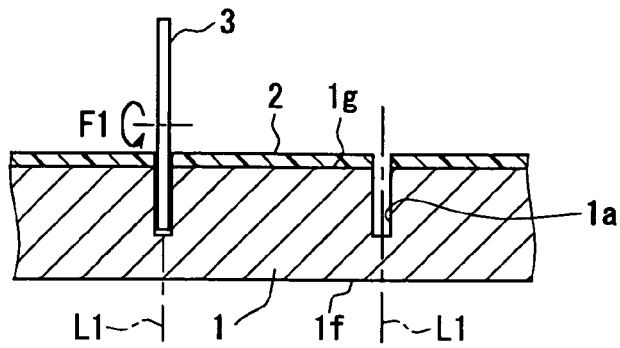
FIGS. 1A to 1D are cross-sectional views of a separation process of a semiconductor substrate in a first embodiment of the present invention.
Figure 1B:
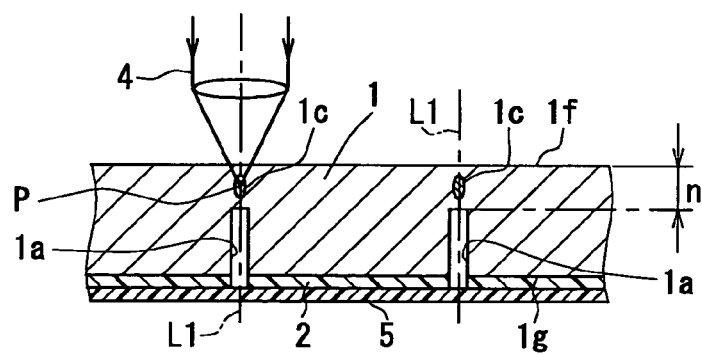

Then, in the step shown in FIG. 1B, a dicing film is adhered on a reverse side (implementation side) of the DAF 2. The semiconductor substrate 1 is flipped to receive a laser beam 4 irradiated from a surface 1f side to have a focusing point P on an extension of the cut 1a in the substrate. The focusing point P traces the separation line L1. The focusing point P of the laser beam forms the modified area 1c in the substrate 1 by a multiphoton absorption. The depth of the focusing point P is changed to have a plurality of the modified areas 1c layered in the substrate 1 within a range of thickness indicated by n in the figure. For example, a plurality of the modified areas 1c are formed successively in a direction of thickness, or in a plurality of places by changing the focusing point P to make the separation of the substrate 1 easier when the thickness n is relatively thick.

The multiphoton absorption caused by absorption of homogeneous and/or heterogeneous photons in a material generates an optical damage in a proximity of the focusing point P in the substrate 1. As a result, a thermal strain is induced to cause a crack around the focusing point P. The crack collectively forms the modified area 1c. The intensity of the laser beam 4 is determined by a peak power density (W/cm$^2$) at the focusing point P when the laser beam 4 is a pulse beam. For example, the multiphoton absorption occurs when the peak power density is greater than $1\times10^8$ (W/cm$^2$) and the pulse width is less than 1 μs. The laser beam is generated, for example, by a YAG (Yttrium Aluminum Garnet) laser. The wavelength of the laser beam is, for example, 1064 nm in an infrared area.

Figure 1C:
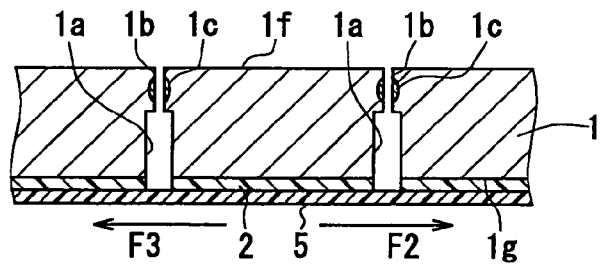

Then, in the step shown in FIG. 1C, the dicing film 5 is pulled in directions indicated by arrows F2 and F3 by a tape expand device or the like. In this manner, the collective form of cracks in the modified area 1c is developed to form a cut 1b along the separation line L1 by an application of shearing force.

Figure 1D:
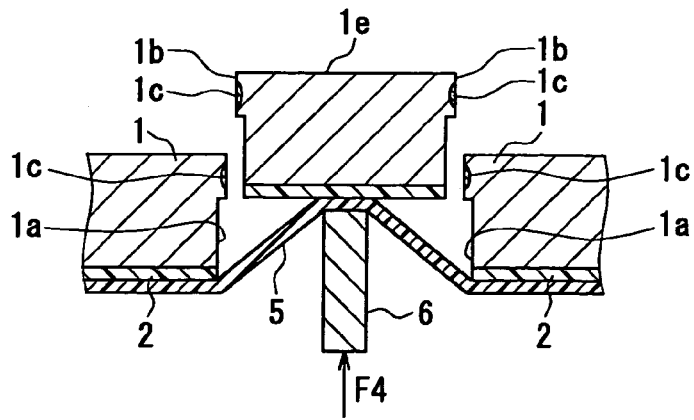

Then, in the step shown in FIG. 1D, the semiconductor chip 1e is picked up by pressing a portion between the cuts 1b, 1b with a press member 6 from the reverse side 1g of the portion toward an upper direction indicated by an arrow F4.

The separation method in the first embodiment of the present invention has advantages over a prior art in the following manner. That is, the DAF 2 is separated prior to the separation of the substrate 1 for accurately shaping the DAF 2. The shape of the DAF 2 is suitably fitted to the shape of the semiconductor chip 1e for preventing defective implementation.

Further, the laser beam 4 is used to form the modified area 1c along the separation line L1 to save the loss of the substrate caused by the width of the dicing blade, and to prevent chipping of the substrate. Therefore, the yield rate of the semiconductor chip 1e is improved.

Furthermore, the separation line L1 is partially separated by the cut 1a, the laser beam irradiation time for separation becomes shorter because the number of layers of the modified areas required for separation decreases.

Furthermore, the laser beam 4 is not absorbed by the surface 1f of the semiconductor substrate 1, the surface 1f of the substrate 1 does not melt.

Second Embodiment

FIG. 2A to 2D show cross-sectional views of a separation process of the semiconductor substrate in a second embodiment. The separation method described in the second embodiment does not use the diamond blade for separation.

Like parts have like numbers as used in the first embodiment, and descriptions of like parts are omitted.

Figure 2A:
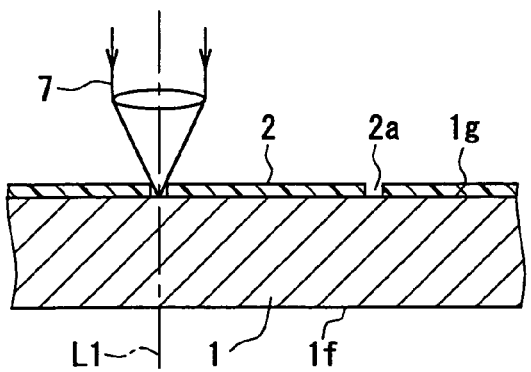
FIGS. 2A to 2D are cross-sectional views of a separation process of the semiconductor substrate in a second embodiment.

In the process shown in FIG. 2A, the DAF 2 is meltingly separated by a laser beam 7 having the focusing point put on the DAF 2 along the separation line L1 irradiated from the reverse side 1g. The intensity of the laser beam 7 is strong enough to melt and separated the DAF 2.

Figure 2B:
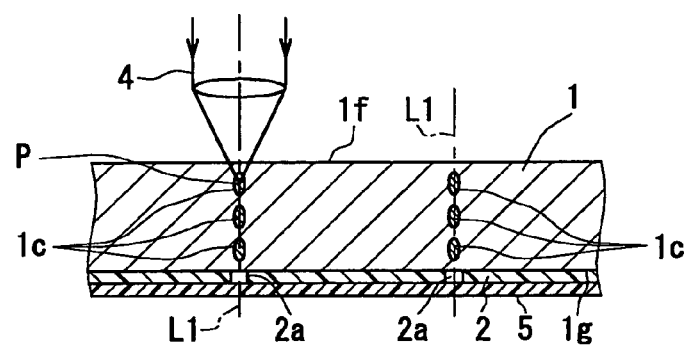

In the process shown in FIG. 2B, the dicing film 5 is adhered on the reverse side (implementation side) of the DAF 2. Then, the semiconductor substrate 1 is flipped to have the laser beam 4 from an upper side of the substrate 1. The focusing point P of the laser beam 4 is aimed at a bottom of the substrate to form the modified area 1c along the separation line L1 in the first place. Position of the focusing point P is moved upward toward the upper surface to form at least another layer of the modified area 1c along the separation line L1. The first layer and the second layer of the modified areas 1c may be connected or may be disconnected in the substrate 1. A numeral 2a indicates a gap between the DAF 2 separated on a surface of the substrate 1.

Figure 2C:
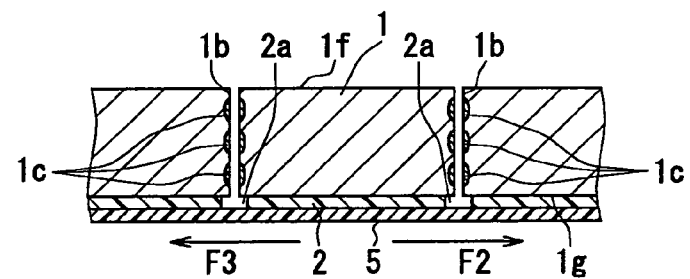

In the process shown in FIG. 2C, the dicing film 5 are pulled away from each other in directions indicated by the arrows F2 and F3. In this manner, the collective form of cracks in the modified area 1c is developed to form a cut 1b along the separation line L1 by an application of shearing force.

Figure 2D:
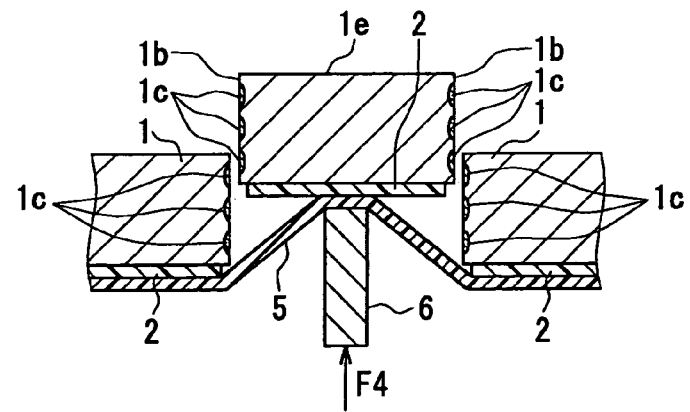

Then, in the step shown in FIG. 2D, the semiconductor chip 1e is picked up by pressing a portion between the cuts 1b, 1b with a press member 6 from the reverse side 1g of the portion toward an upper direction indicated by an arrow F4.

The separation method in the second embodiment of the present invention has advantages over a prior art in the following manner. That is, the DAF 2 is separated prior to the separation of the substrate 1 for accurately shaping the DAF 2. The shape of the DAF 2 is suitably fitted to the shape of the semiconductor chip 1e for preventing defective implementation.

Further, the laser beam 4 is used to form the modified area 1c along the separation line L1 to save the loss of the substrate caused by the width of the dicing blade, and to prevent chipping of the substrate. Therefore, the yield rate of the semiconductor chip 1e is improved.

Third Embodiment

FIGS. 3A to 3D show cross-sectional views of a separation process of the semiconductor substrate in a third embodiment. In this embodiment, the DAF 2 is separated by a formation of the modified area with the laser beam from the surface of the semiconductor substrate. Like parts have like numbers as used in the second embodiment, and descriptions of like parts are omitted.

Figure 3A:
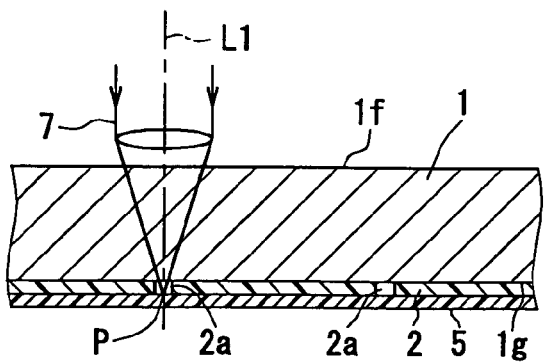
FIGS. 3A to 3D are cross-sectional views of a separation process of the semiconductor substrate in a third embodiment.

In the process shown in FIG. 3A, the dicing film 5 is adhered on the DAF 2. Then, the laser beam 7 is used to meltingly separate the semiconductor substrate 1. The laser beam 7 is irradiated from the surface 1f along the separation line L1 with the focusing point P aligned on the DAF 2. Each of the separation lines L1 on the DAF 2 is separated in this manner.

Figure 3B:
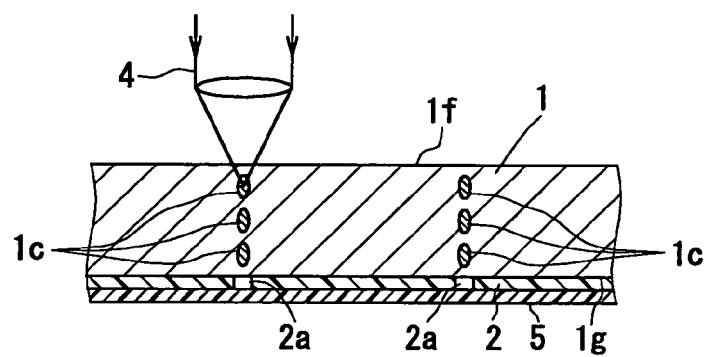
Figure 3C:
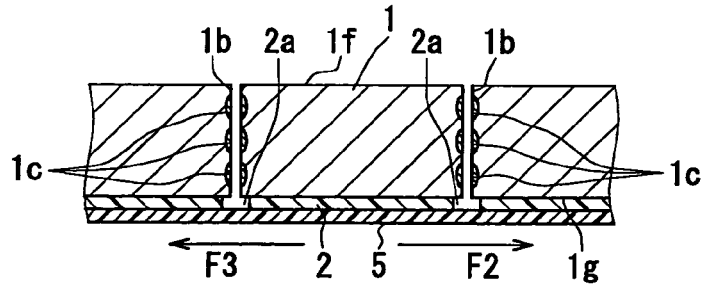
Figure 3D:
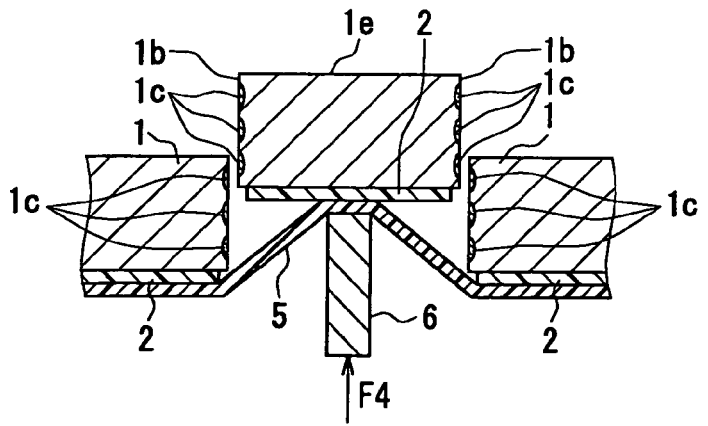
Figure 4A:
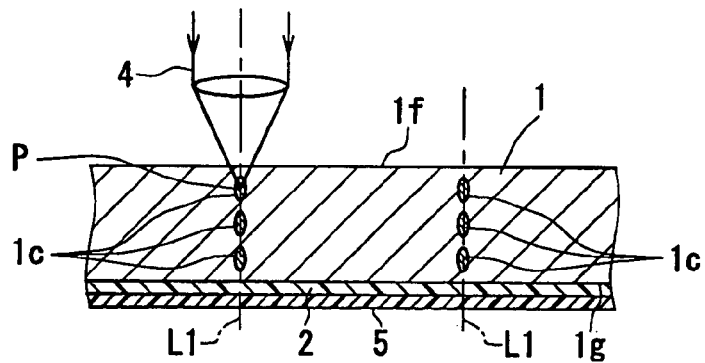
FIGS. 4A to 4C are cross-sectional views of a separation process of the semiconductor substrate in a conventional method.
Figure 4B:
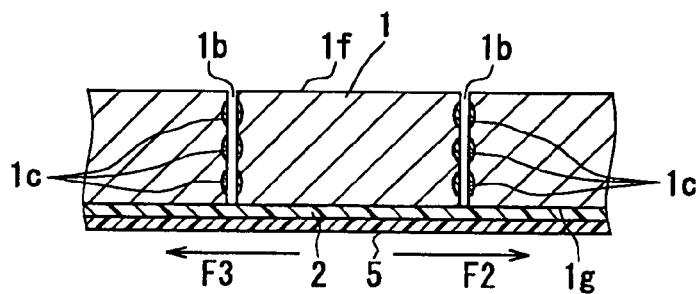
Figure 4C:
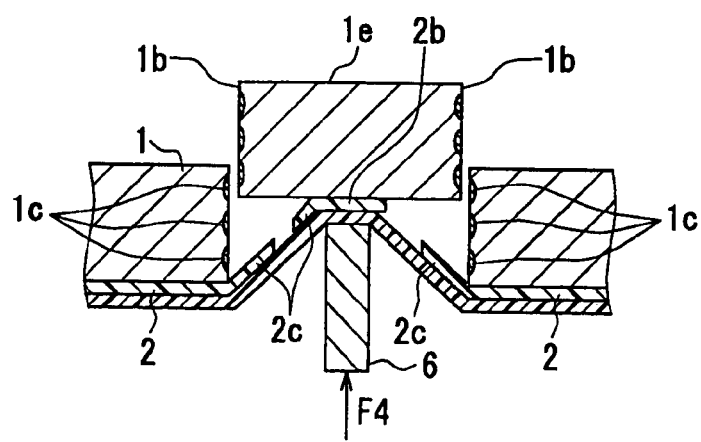

In the process shown in FIG. 3B to 3D, the semiconductor chip 1e is picked up by separating the semiconductor substrate 1 along the separation line L1 in the same process as described in the second embodiment shown in FIGS. 2B to 2D.

The separation method in the third embodiment of the present invention has advantages over a prior art in the following manner. That is, the laser beam 7 and the laser beam 4 are irradiated from the surface 1f of the semiconductor substrate 1. Therefore, the semiconductor substrate 1 needs not to be flipped when the laser beam 7 and the laser beam 4 are switched. As a result, a total separation time of the semiconductor substrate 1 is decreased. Regarding the process for forming the modified area 1c and the process executed thereafter, the third embodiment is expected to have the same effect as described in the second embodiment.

Other Embodiment

Although the present invention has been fully described in connection with the preferred embodiments thereof with reference to the accompanying drawings, it is to be noted that various changes and modifications will become apparent to those skilled in the art.

For example, the separation of the DAF 2 and the formation of the modified area 1c may be conducted by different types of laser beams in the second and the third embodiment. However, a same type laser beam may be used to separate the substrate 1 and to form the modified area 1c. The laser beam source is simplified in the above-described manner to have a cost-effective substrate separation system. Maintenance cost of the system may also be decreased in the above-described manner.

Further, the laser beams 4 and 7 from the same laser beam source may be used to form a plurality of the modified areas at different depths from the surface 1f of the substrate 1 when the focusing points of the beams are controlled. In this manner, the separation time of the semiconductor substrate 1 is decreased.

Furthermore, the cut 1a may be formed in the semiconductor substrate 1 before forming the modified area 1c, or may be formed after forming the modified area 1c in the first embodiment.

Furthermore, the modified area 1c may be formed before the DAF 2 is separated, or may be formed after the DAF 2 is separated.

Furthermore, the laser beam may be moved to form the modified area 1c along the separation line L1, or the semiconductor substrate 1 may be moved instead. Both of the laser beam and the semiconductor substrate 1 may be moved at the same time.

Furthermore, the laser beam is irradiated from both sides, i.e., the surface 1f and the reverse surface 1g, of the semiconductor substrate 1 to form the modified area. The laser beams from both sides may be used simultaneously or may be used in sequence to form the modified area 1c.

Furthermore, the above-described embodiments use DAF for implementing the semiconductor chip 1e. However, a metal foil may be used to implement the semiconductor chip 1e by soldering in the present embodiment.

Furthermore, the separation of the implementation member such as DAF 2, the metal foil and the like may be executed by a sharp edged tool beside using the diamond blade.

Furthermore, a solid matter having a curved surface, that is, a spherical unit, may be used to separate the semiconductor substrate 1. The spherical unit may be used to generate a force in directions F2 and F3 to separate the semiconductor substrate 1.

Such changes and modifications are to be understood as being within the scope of the present invention as defined by the appended claims.

What is claimed is:

1. A method for separating at least one semiconductor chip from a semiconductor substrate, wherein the substrate includes an implementation member adhered to a first side of the semiconductor substrate, the method comprising the steps of:

severing the implementation member on the first side of the semiconductor substrate along a separation line, which is defined by a virtual plane intersecting the semiconductor substrate;

combining a film member with the implementation member on the first side of the semiconductor substrate;

forming a modified area by a multiphoton absorption induced by irradiation of a laser beam on at least one of the first side of the semiconductor substrate and a second side, which is opposite to the first side, with a focusing point of the laser beam located on the virtual plane in the semiconductor substrate; and severing and removing the at least one semiconductor chip at the separation line in the semiconductor substrate.

2. The method according to claim 1, wherein a portion of the semiconductor substrate is thinned in a process of cutting the implementation member.

3. The method according to claim 1, wherein the method includes, prior to the severing of the implementation member, applying the implementation member to the substrate so that the implementation member extends continuously for a distance that spans at least a chip area of the substrate, which is an area of the substrate that corresponds to the at least one semiconductor chip.

4. A method for separating at least one semiconductor chip from a semiconductor substrate comprising the steps of:

a) severing an implementation member, which is adhered to a first side of the semiconductor substrate, with a first laser beam along a separation line, which is defined by a virtual plane intersecting the semiconductor substrate;

b) forming a modified area by multiphoton absorption with a second laser beam irradiated on at least one of two sides of the semiconductor substrate;

c) combining a film member with the implementation member for holding the semiconductor substrate in order; and d) severing and removing the at least one semiconductor chip at the separation line from the semiconductor substrate, wherein the order of steps b) and c) is interchangeable.

5. The method according to claim 4, wherein the first laser beam and the second laser beam are irradiated on a same side of the semiconductor substrate.

6. The method according to claim 4, wherein the first laser beam and the second laser beam originate in a single laser beam source.

7. The method according to claim 4 wherein the method includes, prior to the severing of the implementation member, applying the implementation member to the substrate so that the implementation member extends continuously for a distance that spans at least a chip area of the substrate, which is an area of the substrate tat corresponds to the at least one semiconductor chip.

8. A method for separating at least one semiconductor chip from a semiconductor substrate, wherein the at least one semiconductor chip corresponds to a chip area on the substrate, the method comprising the steps of:

adhering a film to a first side of the substrate, wherein the film extends continuously at least for a distance spanning the chip area;

destructively severing the film along a separation line, which is defined by an intersection of a virtual plans with the semiconductor substrate, wherein the continuity of the film is broken by the severing;

adhering a dicing tape to the film on the first side of the semiconductor substrate;

forming a modified area by a multiphoton absorption induced by irradiation of a laser beam on at least one of the first side of the semiconductor substrate and a second side, which is opposite to the first side, with a focusing point of the laser beam located on the virtual plane in the semiconductor substrate; and applying force to the substrate to separate the at least one semiconductor chip from the semiconductor substrate at the separation line.

* * * * *